(12) United States Patent
Miura et al.

(10) Patent No.: US 11,047,503 B2
(45) Date of Patent: Jun. 29, 2021

(54) ACTUATOR, VALVE DEVICE, AND FLUID SUPPLY SYSTEM

(71) Applicant: FUJIKIN INCORPORATED, Osaka (JP)

(72) Inventors: Takeru Miura, Osaka (JP); Tsutomu Shinohara, Osaka (JP); Tomohiro Nakata, Osaka (JP); Toshiyuki Inada, Osaka (JP); Kazunari Watanabe, Osaka (JP); Kenta Kondo, Osaka (JP); Hidenobu Sato, Osaka (JP); Tomoko Yuhara, Osaka (JP)

(73) Assignee: FUJIKIN INCORPORATION, Osaka (JP)

( * ) Notice: Subject to any disclaimer, the term of this patent is extended or adjusted under 35 U.S.C. 154(b) by 0 days.

(21) Appl. No.: 16/733,647

(22) Filed: Jan. 3, 2020

(65) Prior Publication Data
US 2020/0141428 A1 May 7, 2020

Related U.S. Application Data

(63) Continuation of application No. PCT/JP2018/023882, filed on Jun. 22, 2018.

(30) Foreign Application Priority Data

Jul. 4, 2017 (JP) .............................. JP2017-131484

(51) Int. Cl.
*F15B 13/02* (2006.01)
*F16K 31/122* (2006.01)
*F15B 13/04* (2006.01)

(52) U.S. Cl.
CPC .......... *F16K 31/122* (2013.01); *F15B 13/025* (2013.01); *F15B 13/027* (2013.01); *F15B 13/0405* (2013.01)

(58) Field of Classification Search
CPC .. F15B 13/025; F15B 13/027; F15B 13/0405; F15B 15/14; F15B 15/1433;
(Continued)

(56) References Cited

U.S. PATENT DOCUMENTS 2,976,852 A * 3/1961 Goldring ............. F15B 13/0402
91/54
3,303,746 A * 2/1967 Schmoeger ........... F15B 15/223
91/26
(Continued)

FOREIGN PATENT DOCUMENTS

CN 101233350 A 7/2008
JP S5362582 U 5/1978
(Continued)

OTHER PUBLICATIONS

International Search Report corresponding to Application No. PCT/JP2018/023882; dated Sep. 11, 2018.
(Continued)

*Primary Examiner* — Thomas E Lazo
(74) *Attorney, Agent, or Firm* — Cantor Colburn LLP

(57) ABSTRACT

An actuator includes: a casing; a pressure reducing valve and a piston. The pressure reducing valve is provided in the casing to reduce a pressure of a driving fluid supplied from an outside of the casing to a predetermined level. The piston is provided in the casing to form a pressure chamber together with the casing. The piston is driven by the driving fluid that has been pressure-reduced to the predetermined level.

7 Claims, 6 Drawing Sheets

(58) Field of Classification Search
CPC .. F15B 15/1438; F15B 15/149; F16K 31/122; F16K 31/124
See application file for complete search history.

(56) References Cited

U.S. PATENT DOCUMENTS

| | | | | |
|---|---|---|---|---|
| 3,559,531 | A * | 2/1971 | Leibfritz | F15B 15/223 91/26 |
| 3,674,041 | A * | 7/1972 | Beals | F15B 15/149 137/1 |
| 4,099,450 | A * | 7/1978 | Mase | B23Q 5/26 83/617 |
| 5,186,434 | A * | 2/1993 | Nishimura | F16K 7/14 251/331 |
| 5,442,992 | A * | 8/1995 | Sanner | F15B 13/021 91/428 |
| 6,092,550 | A * | 7/2000 | Gotch | F16K 7/16 137/331 |
| 6,244,562 | B1 * | 6/2001 | Ejiri | F16K 7/16 251/331 |
| 7,823,859 | B2 * | 11/2010 | Ejiri | F16K 31/1225 251/60 |
| 8,256,744 | B2 * | 9/2012 | Tanikawa | F16K 31/1225 251/331 |
| 8,770,221 | B2 * | 7/2014 | Ishitoya | G05D 16/10 137/505.41 |
| 9,404,592 | B2 * | 8/2016 | Akamoto | F16K 31/122 |
| 9,416,889 | B2 * | 8/2016 | Nishimura | F16K 31/50 |
| 9,995,322 | B2 | 6/2018 | Ejiri et al. | |
| 10,132,415 | B2 * | 11/2018 | Tanikawa | F16K 31/122 |
| 2010/0320408 | A1 * | 12/2010 | Nakata | F16K 31/1225 251/205 |

FOREIGN PATENT DOCUMENTS

| | | |
|---|---|---|
| JP | H01178285 U | 12/1989 |
| JP | 2012026577 A | 2/2012 |
| JP | 2015068438 A | 4/2015 |
| WO | 2016056066 A1 | 4/2016 |

OTHER PUBLICATIONS

KIPO Notification of Reason for Refusal for corresponding KR Application No. 10-2019-7038314; dated Nov. 20, 2020.

* cited by examiner

⇨ FLOW OF DRIVING FLUID

ACTUATOR, VALVE DEVICE, AND FLUID SUPPLY SYSTEM

CROSS REFERENCE TO RELATED APPLICATION

This application is a bypass continuation application of International Application No. PCT/JP2018/023882, filed Jun. 22, 2018, which claims priority to Japanese Patent Application No. 2017-131484, filed Jul. 4, 2017. The contents of these applications are incorporated herein by reference in their entirety.

TECHNICAL FIELD

The present disclosure relates to an actuator, a valve device and a fluid supply system.

BACKGROUND

Conventionally, it has been required to open/close, at a constant speed, a valve device to be opened/closed using a driving fluid (see, e.g., Japanese Patent Application Publication No. 2015-068438). In the valve device disclosed in Japanese Patent Application Publication No. 2015-068438, two needle valves and two check valves are provided in an air drive portion to reduce fluctuations in an operating speed of an actuator and reduce fluctuations in a speed of opening/closing the valve device.

SUMMARY

However, since the valve device disclosed in Japanese Patent Application Publication No. 2015-068438 has the two needle valves and the two check valves in the air drive portion, a configuration of an entire system thereof is complicated.

It is therefore an object of the present disclosure to provide an actuator, a valve device, and a fluid supply system which can reduce fluctuations in operating speed using a simple configuration.

An actuator in accordance with one or more embodiments includes: a casing; a pressure reducing valve provided in the casing to reduce a pressure of a driving fluid supplied from an outside of the casing to a predetermined level; and a piston provided in the casing to form a pressure chamber together with the casing and driven by the driving fluid that has been pressure-reduced to the predetermined level.

A valve device in accordance with one or more embodiments includes: a body in which a fluid passage is formed; a valve body which opens and closes the fluid passage; a stem which moves closer to and away from the body to cause the valve body to open and close the fluid passage; a casing; a pressure reducing valve provided in the casing to reduce a pressure of a driving fluid supplied from an outside of the casing to a predetermined level; and a drive portion provided in the casing to drive the stem using the driving fluid that has been pressure-reduced to the predetermined level resulting from the pressure reduction by the pressure reducing valve.

A fluid supply system in accordance with one or more embodiments includes a supply source which supplies a driving fluid; a valve device to be driven using the driving fluid supplied from the supply source, the valve device including a body in which a fluid passage is formed, a valve body which opens and closes the fluid passage, a stem which moves closer to and away from the body to cause the valve body to open and close the fluid passage, and an actuator having therein a pressure reducing valve which reduces a pressure of the driving fluid to a predetermined level and a drive portion which drives the stem using the driving fluid that has been pressure-reduced to the predetermined level; and a switching member which switches between a flow of the driving fluid supplied from the supply source to the valve device and a flow of the driving fluid discharged from the drive portion of the valve device to an outside thereof.

DETAILED DESCRIPTION

Figure 1:
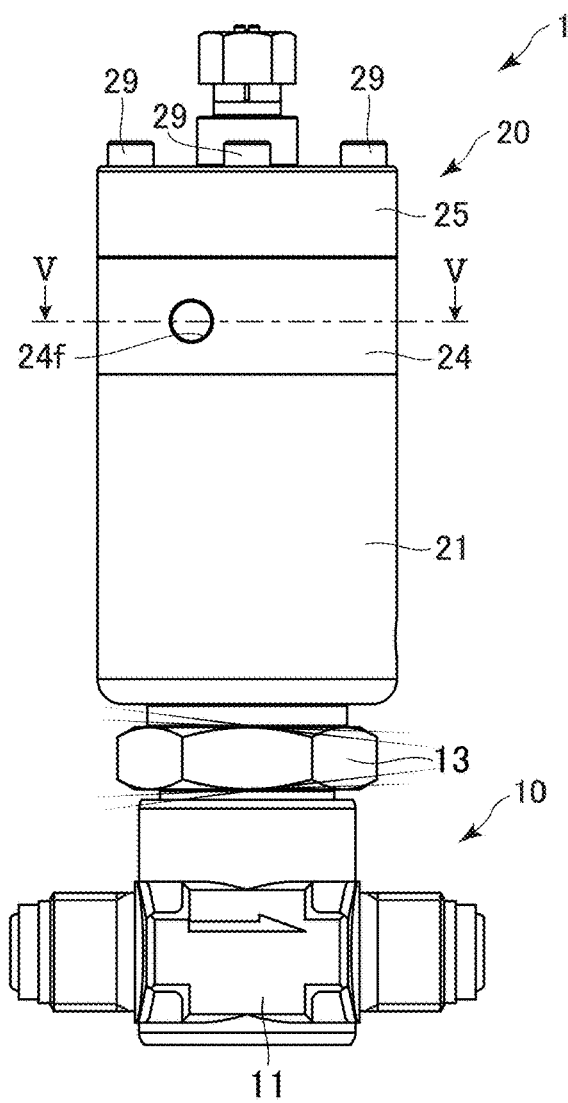
FIG. 1 is a front view of a valve device according to an embodiment.

Referring to the drawings, a description will be given of a valve device according to an embodiment of the present disclosure.

Figure 2:
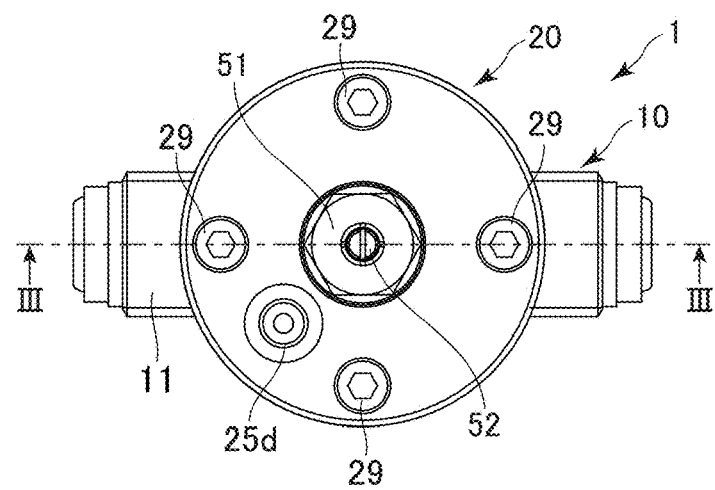
FIG. 2 is a top view of the valve device according to the present embodiment.
Figure 3:
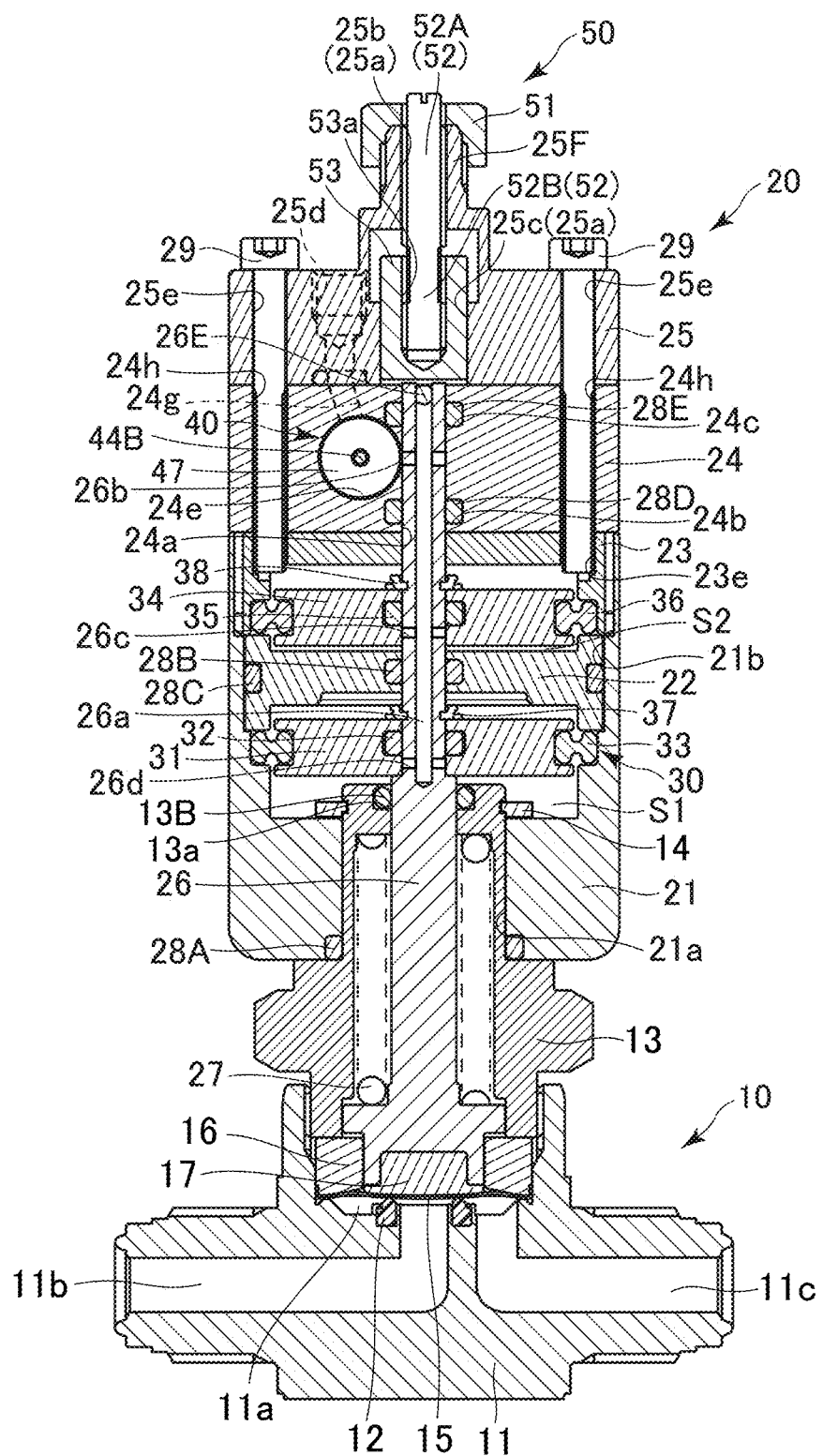
FIG. 3 is a cross-sectional view of the valve device illustrated in FIG. 2 along a line III-III.
Figure 4:
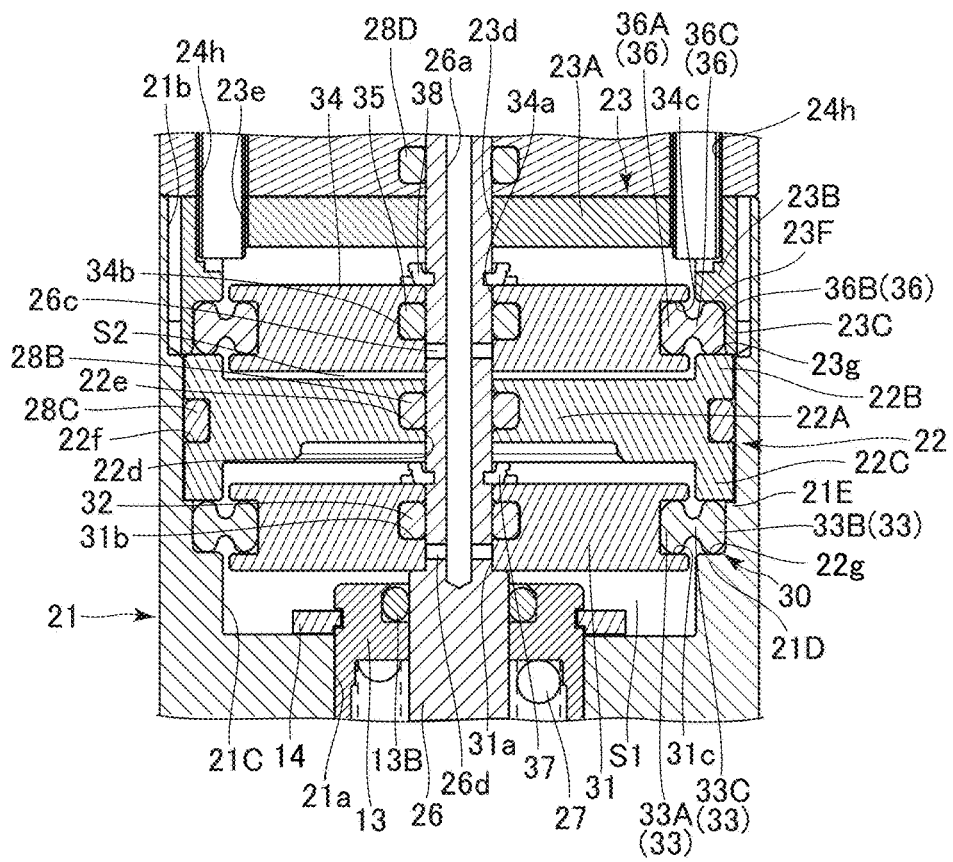
FIG. 4 is a cross-sectional view in which the vicinity of a partition disc is illustrated in enlarged relation.
Figure 5:
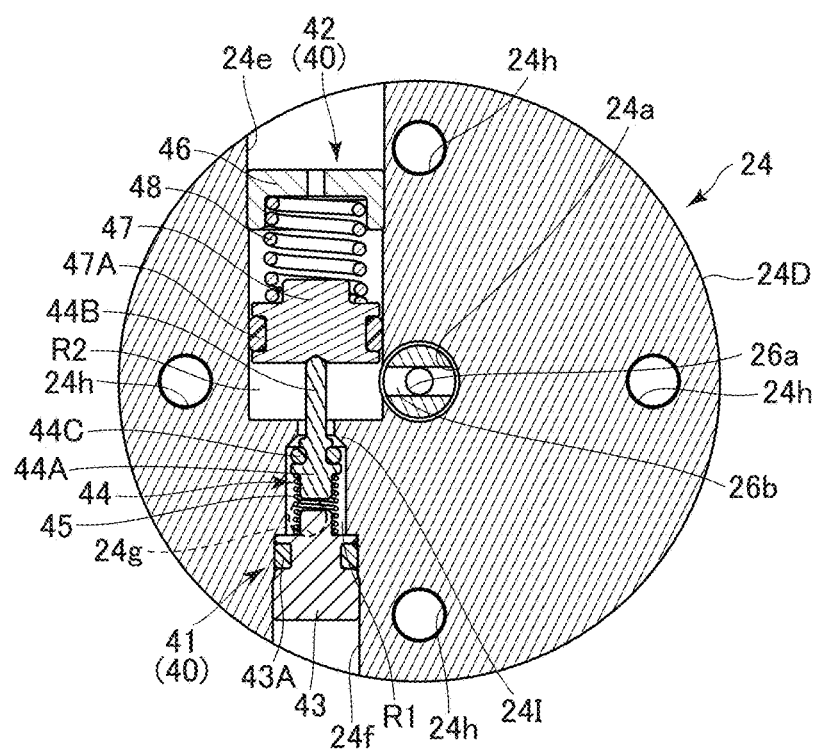
FIG. 5 is a cross-sectional view of the valve device illustrated in FIG. 1 along a line V-V.

FIG. 1 is a front view of a valve device 1 according to the present embodiment. FIG. 2 is a top view of the valve device 1 according to the present embodiment. FIG. 3 is a cross-sectional view of the valve device 1 illustrated in FIG. 2 along a line FIG. 4 is a cross-sectional view in which the vicinity of a partition disc 22 is illustrated in enlarged relation. FIG. 5 is a cross-sectional view of the valve device 1 illustrated in FIG. 1 along a line V-V. Note that the valve device 1 according to the present embodiment is a diaphragm valve.

As illustrated in FIG. 1, the valve device 1 includes a body 10 and an actuator 20. Note that the following description will be given on the assumption that an actuator 20 side of the valve device 1 is an upper side, while a body 10 side of the valve device 1 is a lower side.

[Body 10]

As illustrated in FIG. 3, the body 10 includes a body main body 11, a sheet 12, a bonnet 13, a retaining ring 14, a diaphragm 15, a retaining adapter 16, and a diaphragm retainer 17.

In the body main body 11, a valve chamber 11a, and a fluid inflow path 11b and a fluid outflow path 11c each communicating with the valve chamber 11a are formed. The sheet 12 has an annular shape and is provided around a peripheral edge of a portion in which the valve chamber 11a and the fluid inflow path 11b communicate with each other.

The bonnet 13 has a generally cylindrical shape and has an external thread portion provided around an outer periphery of a lower end portion thereof screwed into an internal thread portion provided in the body main body 11 to be fixed to the body main body 11 so as to cover the valve chamber 11a. The retaining ring 14 is attached to an outer periphery of an upper end portion of the bonnet 13 so as to fix the actuator 20 to the body 10.

In the upper end portion of the bonnet 13, a recessed portion 13a is formed and, in the recessed portion 13a, a first O-ring 13B having a circular cross section is provided. The first O-ring 13B guides vertical movement (movement to be closer to and away from the diaphragm 15) of a stem 26, and prevents the driving fluid from leaking from a first pressure chamber S1 described later to an outside thereof.

The diaphragm 15 as a valve body has an outer peripheral edge portion thereof pressed and held between the retaining adapter 16 disposed at a lower end of the bonnet 13 and a bottom surface of the body main body 11 forming the valve chamber 11a. The diaphragm 15 is in the form of a spherical shell and has an upwardly protruding arc shape in a natural state. The diaphragm 15 moves away from and comes into contact with the sheet 12 to open/close a fluid passage. For example, the diaphragm 15 is formed of a metal thin plate cut out into a circular shape which is then formed into the spherical shell shape having an upwardly protruding center portion.

The diaphragm retainer 17 is provided over the diaphragm 15 and configured to be able to press the center portion of the diaphragm 15.

[Actuator 20]

The actuator 20 has a generally cylindrical overall shape, and is configured to include a lower casing 21, the partition disc 22, a support disc 23, an intermediate casing 24, an upper casing 25, the stem 26, compression coil springs 27, second to sixth O-rings 28A to 28E each having a circular cross section, four bolts 29 (see FIG. 2), a drive portion 30, a pressure reducing valve 40, and a lift amount adjustment mechanism 50. Note that the lower casing 21, the partition disc 22, the support disc 23, the intermediate casing 24, and the upper casing 25 form a casing of the actuator 20.

The lower casing 21 has a generally cylindrical shape and is formed with a bonnet through hole 21a through which the bonnet 13 extends and a drive portion containing hole 21b in which the drive portion 30 is contained.

Through the bonnet through hole 21a, an upper portion of the bonnet 13 extends, and an upper end of the bonnet 13 is fixed by the retaining ring 14 to the lower casing 21. In an inner peripheral surface 21C in which the drive portion containing hole 21b is formed, a first stepped portion 21D and a second stepped portion 21E are formed. In addition, between the lower casing 21 and the bonnet 13, the second O-ring 28A is interposed to prevent the driving fluid from leaking from the first pressure chamber S1 described later to the outside thereof and prevent dust or the like from entering the actuator 20 from an outside thereof.

The partition disc 22 is provided in the lower casing 21 and has a first disc portion 22A, an upwardly protruding portion 22B, and a first downwardly protruding portion 22C. The first disc portion 22A has a generally disc shape having, at a center thereof, a first stem through hole 22d formed therein to allow the stem 26 to extend therethrough, while having, in an inner periphery and an outer periphery thereof, first and second O-ring containing grooves 22e and 22f formed to extend around the inner and outer peripheries and have annular shapes. In the first and second O-ring containing grooves 22e and 22f, the third and fourth O-rings 28B and 28C are contained. The third O-ring 28B guides the vertical movement of the stem 26 to prevent the driving fluid from leaking out of a second pressure chamber S2 described later.

The upwardly protruding portion 22B has an annular shape and protrudes upward from an outer peripheral edge of an upper surface of the first disc portion 22A. The first downwardly protruding portion 22C has an annular shape and protrudes downward from an outer peripheral edge of a lower surface of the first disc portion 22A. The first downwardly protruding portion 22C has a lower end thereof in contact with the second stepped portion 21E of the lower casing 21, and the first downwardly protruding portion 22C and the first stepped portion 21D of the lower casing 21 form an annular first outer peripheral portion containing groove 22g. The first outer peripheral portion containing groove 22g corresponds to a first annular groove formed in an inner periphery of the casing.

The support disc 23 is located over the partition disc 22, and has an external thread portion provided in an outer periphery thereof screwed into an internal thread portion provided in an inner periphery of an upper end portion of the lower casing 21 to be fixed to the lower casing 21 so as to close the drive portion containing hole 21b.

The support disc 23 has a second disc portion 23A, a second downwardly protruding portion 23B, and a third downwardly protruding portion 23C. The second disc portion 23A has a generally disc shape having, at a center thereof, a second stem through hole 23d formed therein to allow the stem 26 to extend therethrough. In the second disc portion 23A, fourth bolt screwing holes 23e (of which only two are illustrated in FIG. 4) are further formed.

The second downwardly protruding portion 23B has an annular shape and protrudes downward from an outer peripheral edge of a lower surface of the second disc portion 23A. The third downwardly protruding portion 23C has an annular shape and protrudes downward from an outer peripheral edge of a lower surface of the second downwardly protruding portion 23B. The third downwardly protruding portion 23C is configured to have a radial thickness smaller than a radial thickness of the second downwardly protruding portion 23B. Due to the thickness difference therebetween, a third stepped portion 23F is formed.

The third downwardly protruding portion 23C has a lower end thereof in contact with the upwardly protruding portion 22B of the partition disc 22, and the third stepped portion 23F and the upwardly protruding portion 22B form an annular second outer peripheral portion containing groove 23g. Note that first stepped portion 21D, the second stepped portion 21E, the upwardly protruding portion 22B and the first downwardly protruding portion 22C of the partition disc 22, and the second downwardly protruding portion 23B and the third downwardly protruding portion 23C of the support disc 23 form an inner peripheral portion of the casing. The second outer peripheral portion containing groove 23g corresponds to a first annular groove formed in the inner peripheral portion of the casing.

As illustrated in FIG. 3, the intermediate casing 24 has a generally cylindrical shape, and is provided over the lower casing 21 and the support disc 23. The intermediate casing 24 has, at a center thereof, a third stem through hole 24a formed to extend therethrough along a vertical direction. In an inner periphery of the intermediate casing 24, third and fourth O-ring containing grooves 24b and 24c are formed to extend around the inner periphery and have annular shapes.

In the third and fourth O-ring containing grooves 24*b* and 24*c*, fifth and sixth O-rings 28D and 28E are contained. The fifth and sixth O-rings 28D and 28E guide the vertical movement of the stem 26 to prevent the driving fluid from leaking to an outside of the actuator 20.

Also, as illustrated in FIG. 5, the intermediate casing 24 has generally cylindrical first and second insertion holes 24*e* and 24*f* formed to inwardly extend from an out peripheral surface 24D thereof. The first and second insertion holes 24*e* and 24*f* are coaxially formed to communicate with each other. The first insertion hole 24*e* also communicate with the third stem through hole 24*a*. The intermediate casing 24 also has a driving fluid passage hole 24*g* (see also FIG. 3) formed therein. The driving fluid passage hole 24*g* extends from an upper surface of the intermediate casing 24 to the second insertion hole 24*f*. The intermediate casing 24 also has four bolt insertion holes 24*h* formed therein.

As illustrated in FIG. 3, the upper casing 25 has a generally cylindrical shape, and is provided over the intermediate casing 24. The upper casing 25 is provided with a protruding portion 25F having, at a center thereof, an adjustment mechanism attachment hole 25*a* formed to extend therethrough along the vertical direction. The adjustment mechanism attachment hole 25*a* has a bolt screwing hole 25*b* and a top insertion hole 25*c* having a hexagonal transverse section.

The upper casing 25 also has a driving fluid inlet port 25*d* and four bolt insertion holes 25*e* (of which only two are shown) each formed therein. The driving fluid inlet port 25*d* is formed at a position located above the second insertion hole 24*f* of the intermediate casing 24 to have an upper end portion thereof connected to a pipe joint not shown and a lower end portion thereof communicating with the driving fluid passage hole 24*g*.

The stem 26 has a generally cylindrical shape and is provided to be movable in the vertical direction and extend from the diaphragm retainer 17 to the upper casing 25 through the bonnet 13, the lower casing 21, and the intermediate casing 24. Depending on an adjusted amount of the lift amount, an upper end of the stem 26 is caused to enter or exit the top insertion hole 25*c* by vertical movement of the stem 26. The stem 26 has a driving fluid inflow path 26*a* formed in an upper half portion thereof to extend in the vertical direction, and further has first to third driving fluid outlet ports 26*b* to 26*d* each formed to traverse the driving fluid inflow path 26*a*.

The driving fluid inflow path 26*a* has an upper end thereof closed by a ball 26E. The first driving fluid outlet port 26*b* communicates with the first insertion hole 24*e*. The second driving fluid outlet port 26*c* is located below the first driving fluid outlet port 26*b* to communicate with the second pressure chamber S2 described later. The third driving fluid outlet port 26*d* is located below the second driving fluid outlet port 26*c* to communicate with the first pressure chamber S1 described later.

In the bonnet 13, the compression coil springs 27 are provided around an outer periphery of a lower half portion of the stem 26 to constantly bias the stem 26 in a downward direction.

The individual bolts 29 are inserted into the bolt insertion holes 25*e* of the upper casing 25 and into the bolt insertion holes 24*h* of the intermediate casing 24 to be screwed into the bolt screwing holes 23*e* of the support disc 23 and thus integrate together the lower casing 21, the intermediate casing 24, and the upper casing 25.

[Drive Portion 30]

The drive portion 30 includes a first piston 31, a seventh O-ring 32, a first seal member 33, a second piston 34, an eighth O-ring 35, a second seal member 36, and retaining rings 37 and 38.

The first piston 31 has a generally disc shape having, at a center thereof, a fourth stem through hole 31*a* formed therein to allow the stem 26 to extend therethrough. In an inner periphery of the first piston 31, a fifth O-ring containing groove 31*b* is formed to continuously extend around the inner periphery and have an annular shape while, in an outer periphery of the first piston 31, a first inner peripheral portion containing groove 31*c* is formed. The first inner peripheral portion containing groove 31*c* corresponds to a second annular groove formed in an outer peripheral portion of a piston.

The seventh O-ring 32 having a circular cross section is contained in the fifth O-ring containing groove 31*b* to prevent the driving fluid from leaking out of the first pressure chamber S1 described later.

The first seal member 33 is an annular member made of a resin, and includes a first inner peripheral portion 33A, a first outer peripheral portion 33B, and a first intermediate portion 33C. The first inner peripheral portion 33A has a generally ellipsoidal cross section and is fitted in the first inner peripheral portion containing groove 31*c*. The first inner peripheral portion 33A corresponds to a first fitting portion. The first outer peripheral portion 33B has a generally ellipsoidal cross section and is fitted in the first outer peripheral portion containing groove 22*g*. The first outer peripheral portion 33B corresponds to a second fitting portion.

The first intermediate portion 33C is located between the first inner peripheral portion 33A and the first outer peripheral portion 33B and configured to have a thickness smaller than that of each of the first inner peripheral portion 33A and the first outer peripheral portion 33B to connect a vertical middle portion of the first inner peripheral portion 33A and a vertical middle portion of the first outer peripheral portion 33B. A maximum distance along an axial direction of the first seal member 33 over which the first inner peripheral portion 33A can move relative to the first outer peripheral portion 33B is limited to a predetermined distance which is not more than half a thickness of the first seal member 33.

The first piston 31, the lower casing 21, and the bonnet 13 form the first pressure chamber S1. The first pressure chamber S1 is sealed by the first O-ring 13B, the second O-ring 28A, the seventh O-ring 32, and the first seal member 33. The first pressure chamber S1 communicates with each of the driving fluid inflow path 26*a* and the third driving fluid outlet port 26*d* which are formed in the stem 26.

The first piston 31 has an upper surface thereof provided with the retaining ring 37 which is attached to the stem 26. Consequently, when the first piston 31 moves upward, the stem 26 moves upward together with the retaining ring 37.

The second piston 34 has a generally disc shape having, at a center thereof, a fifth stem through hole 34*a* formed therein to allow the stem 26 to extend therethrough. In an inner periphery of the second piston 34, a sixth O-ring containing groove 34*b* is formed to continuously extend around the inner periphery and have an annular shape while, in an outer periphery of the second piston 34, a second inner peripheral portion containing groove 34*c* is formed. The second inner peripheral portion containing groove 34*c* corresponds to a second annular groove formed in an outer peripheral portion of the piston.

The eighth O-ring 35 having a circular cross section is contained in the sixth O-ring containing groove 34*b* to prevent the driving fluid from leaking out of the second pressure chamber S2 described later.

The second seal member 36 is an O-ring made of a resin, and includes a second inner peripheral portion 36A, a second outer peripheral portion 36B, and a second intermediate portion 36C. The second inner peripheral portion 36A has a generally ellipsoidal cross section and is fitted in the second inner peripheral portion containing groove 34c. The second inner peripheral portion 36A corresponds to the first fitting portion. The second outer peripheral portion 36B has a generally ellipsoidal cross section and is fitted in the second outer peripheral portion containing groove 23g. The second outer peripheral portion 36B corresponds to the second fitting portion.

The second intermediate portion 36C is located between the second inner peripheral portion 36A and the second outer peripheral portion 36B and configured to have a thickness smaller than that of each of the second inner peripheral portion 36A and the second outer peripheral portion 36B to connect a vertical middle portion of the second inner peripheral portion 36A and a vertical middle portion of the second outer peripheral portion 36B. A maximum distance along an axial direction of the second seal member 36 over which the second inner peripheral portion 36A can move relative to the second outer peripheral portion 36B is limited to a predetermined distance which is not more than half a thickness of the second seal member 36.

The second piston 34 and the partition disc 22 form the second pressure chamber S2. The second pressure chamber S2 is sealed by the third O-ring 28B, the eighth O-ring 35, and the second seal member 36. The second pressure chamber S2 communicates with each of the driving fluid inflow path 26a and the second driving fluid outlet port 26c which are formed in the stem 26.

The second piston 34 has an upper surface thereof provided with the retaining ring 38 which is attached to the stem 26. Consequently, when the second piston 34 moves upward, the stem 26 moves upward together with the retaining ring 38.

[Pressure Reducing Valve 40]

The pressure reducing valve 40 is provided in the intermediate casing 24 and includes a poppet portion 41 and a pressure reducing portion 42.

The poppet portion 41 is provided in the second insertion hole 24f, and includes a poppet plug 43, a poppet 44, and a poppet spring 45. The poppet plug 43 is fitted into the second insertion hole 24f and fixed to the intermediate casing 24, and has a first poppet O-ring 43A. The first poppet O-ring 43A prevents the driving fluid in an inflow chamber R1 described later from leaking to an outside thereof. A space in the second insertion hole 24f which is inner than the poppet plug 43 forms the inflow chamber R1 into which the driving fluid flows. The inflow chamber R1 communicates with the driving fluid passage hole 24g.

The poppet 44 has a poppet main body 44A and a rod 44B. The poppet main body 44A is located in the inflow chamber R1, and has a second poppet O-ring 44C. The second poppet O-ring 44C is configured to move away from and come into contact with a peripheral edge portion 241 of a portion of the intermediate casing 24 in which the first insertion hole 24e and the second insertion hole 24f communicate with each other to provide or cut off communication between the inflow chamber R1 and a decompression chamber R2 described later.

The rod 44B extends from an end portion of the poppet main body 44A closer to the first insertion hole 24e toward the first insertion hole 24e to be located in the decompression chamber R2 described later. The poppet spring 45 is provided between the poppet plug 43 and the poppet 44 to bias the poppet 44 toward the pressure reducing portion 42.

The pressure reducing portion 42 is provided in the first insertion hole 24e, and includes a spring retainer 46, a pressure reducing piston 47, and a pressure reducing spring 48.

The spring retainer 46 is pressed or screwed in the first insertion hole 24e to be fixed to the intermediate casing 24. The pressure reducing piston 47 is provided to be movable in a space in the first insertion hole 24e which is inner than the spring retainer 46, and has a piston O-ring 47A. A space in the first insertion hole 24e which is inner than the pressure reducing piston 47 forms the decompression chamber R2 into which the driving fluid flows. The decompression chamber R2 communicates with each of the first driving fluid outlet port 26b and the driving fluid inflow path 26a via the third stem through hole 24a. The piston O-ring 47A prevents the driving fluid in the decompression chamber R2 from leaking to an outside thereof.

The rod 44B has a leading end thereof in contact with the pressure reducing piston 47. The pressure reducing spring 48 is provided between the spring retainer 46 and the pressure reducing piston 47 to bias the pressure reducing piston 47 toward the poppet portion 41. The poppet spring 45 and the pressure reducing spring 48 have respective biasing forces which are set such that, in a state where the driving fluid has not flown into either the inflow chamber R1 or the decompression chamber R2 or where a pressure increase in the decompression chamber R2 due to inflow of the driving fluid is not sufficient, the second poppet O-ring 44C of the poppet main body 44A moves away from the peripheral edge portion 241 to provide communication between the inflow chamber R1 and the decompression chamber R2.

[Lift Amount Adjustment Mechanism 50]

As illustrated in FIG. 3, the lift amount adjustment mechanism 50 includes a locknut 51, an adjustment screw 52, and an adjustment top 53.

The locknut 51 is attached to an upper end of the protruding portion 25F of the upper casing 25. The adjustment screw 52 has different pitches in an upper portion 52A and a lower portion 52B. The lower portion 52B is configured to have the pitch lower than that of the upper portion 52A. The upper portion 52A of the adjustment screw 52 is screwed into the bolt screwing hole 25b. The adjustment top 53 has a hexagonal transverse section, has a screwing recessed portion 53a formed therein, and is inserted into the top insertion hole 25c to be vertically movable therein. Into the screwing recessed portion 53a, the lower portion 52B of the adjustment screw 52 is screwed.

By rotating the adjustment screw 52, the adjustment top 53 is vertically moved. This adjusts a distance over which the stem 26 vertically moves and adjusts a lift amount of the diaphragm 15. Note that a state where an upper end of the stem 26 is in contact with a lower end of the adjustment top 53 corresponds to a state where the stem 26 is located at an upper dead point.

[Fluid Supply System 2]

Next, referring to FIG. 6, a description will be given of a fluid supply system 2 according to the present embodiment.

Figure 6:
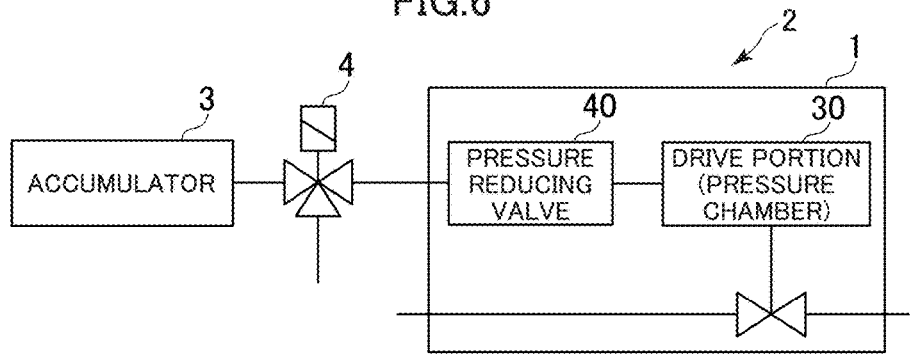
FIG. 6 is a configuration diagram of a fluid supply system according to the present embodiment.

FIG. 6 is a configuration diagram of the fluid supply system 2.

As illustrated in FIG. 6, the fluid supply system 2 includes an accumulator 3, a three-way valve 4 as an electromagnetic valve, and the valve device 1 described above. The accumulator 3 is a supply source which supplies the driving fluid which is, e.g., operating air. The three-way valve 4 is switching unit which switches between a flow of the driving fluid supplied from the accumulator 3 to the valve device 1 and a flow of the driving fluid discharged from the drive portion 30 (first and second pressure chambers S1 and S2) of the valve device 1 to an outside thereof

[Opening/Closing Operation of Valve 1]

Next, referring to FIG. 3, FIG. 4, FIG. 6, and FIG. 7A to FIG. 7D, a description will be given of an opening/closing operation of the valve device 1 in the fluid supply system 2 according to the present embodiment. As pressure conditions in the present embodiment, a pressure of the driving fluid to be supplied from the accumulator 3 to the valve device 1 is set to 0.5 MPa, while a pressure of the driving fluid to be supplied to the first and second pressure chambers S1 and S2 through the decompression chamber R2 is set to 0.35 MPa.

FIG. 7A-FIG. 7D is illustrative view of an operation of the pressure reducing valve 40 during opening/closing of the valve device 1. In FIG. 7A-FIG. 7D, the flows of the driving fluid are shown by hollow arrows.

As illustrated in FIG. 3, in the valve device 1 of the present embodiment, in the state where the driving fluid has not flown into the first and second pressure chambers S1 and S2, the stem 26 under the biasing forces of the compression coil springs 27 is at a lower dead point (close to the body main body 11), while the diaphragm 15 is pressed by the diaphragm retainer 17, and therefore the valve device 1 is in a closed state. In other words, in a normal state (state where the driving fluid is not supplied), the valve device 1 is in the closed state.

Figure 7:
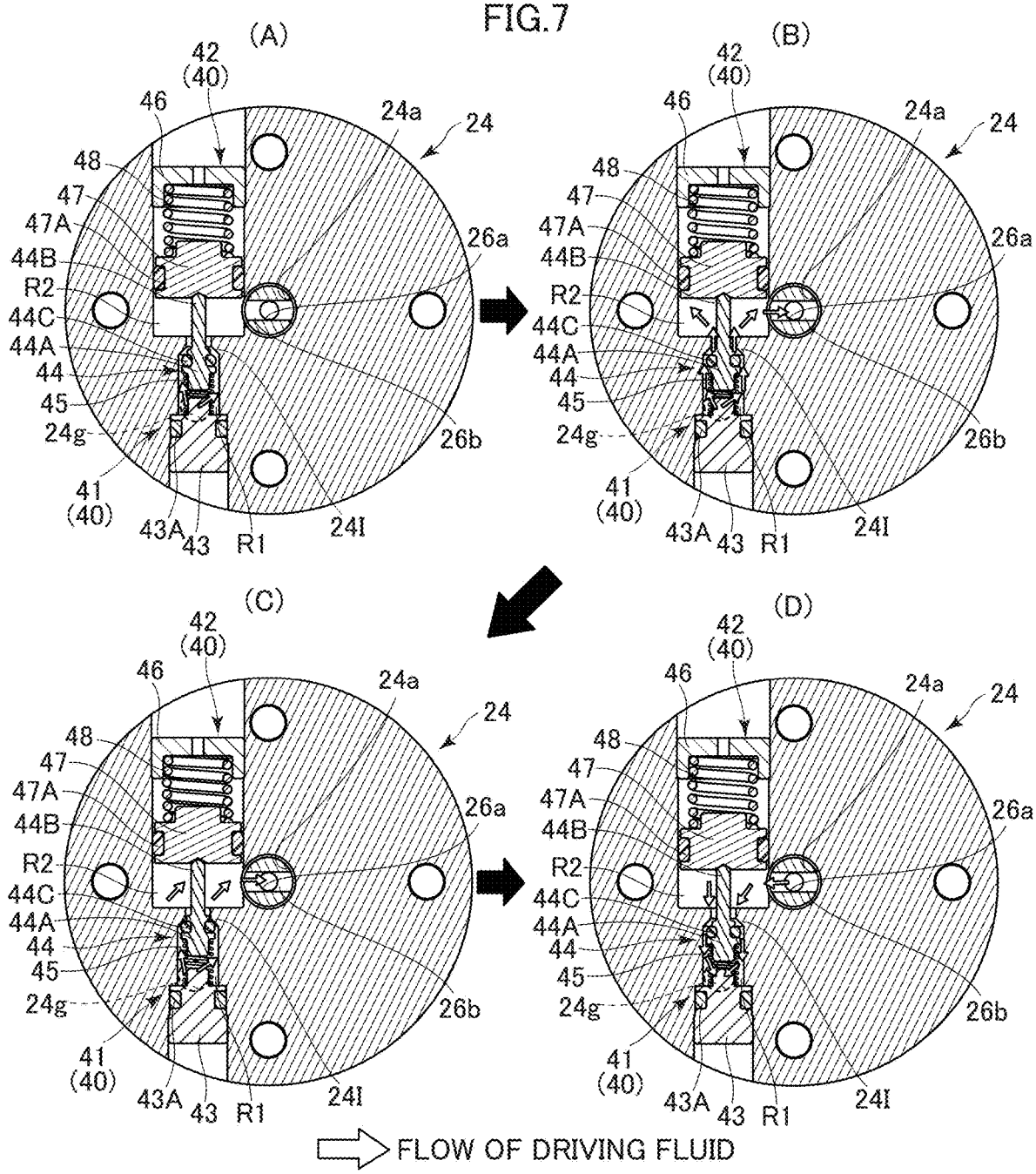
FIG. 7A-FIG. 7D is illustrative view of an operation of a pressure reducing valve device during opening/closing of the valve device.

Then, the three-way valve 4 illustrated in FIG. 6 is brought into a state where the driving fluid flows from the accumulator 3 to the valve device 1. As a result, the driving fluid is supplied from the accumulator 3 to the valve device 1. The driving fluid passes from the driving fluid inlet port 25*d* through the driving fluid passage hole 24*g* via an air tube and a pipe joint which are not shown to flow into the inflow chamber R1, as illustrated in FIG. 7A. The pressure of the driving fluid flows flowing into the inflow chamber R1 is 0.5 MPa.

Since the inflow chamber R1 and the decompression chamber R2 communicate with each other, as illustrated in FIG. 7B, the driving fluid flows into the decompression chamber R2 to increase a pressure in the decompression chamber R2. When the pressure in the decompression chamber R2 increases, the pressure reducing piston 47 moves toward the spring retainer 46 against the biasing force of the pressure reducing spring 48. Then, when the pressure in the decompression chamber R2 reaches 0.35 MPa as a predetermined pressure (drive pressure), as illustrated in FIG. 7C, the second poppet O-ring 44C of the poppet 44 comes into contact with the peripheral edge portion 241 to cut off the communication between the inflow chamber R1 and the decompression chamber R2.

Through the operation from the state illustrated in FIG. 7A to the state illustrated in FIG. 7B, the driving fluid having the predetermined pressure flows from the decompression chamber R2 into the first and second pressure chambers S1 and S2 via the first driving fluid outlet port 26*b*, the driving fluid inflow path 26*a*, the second driving fluid outlet port 26*c*, and the third driving fluid outlet port 26*d*. The fluid supply system 2 is configured such that the driving fluid at 0.5 MPa is supplied from the accumulator 3 into the inflow chamber R1 to maintain the state of the pressure reducing valve 40 illustrated in FIG. 7C.

When the driving fluid flows into the first and second pressure chambers S1 and S2, the first and second pistons 31 and 34 rise against the biasing forces of the compression coil springs 27. As a result, the stem 26 moves to the upper dead point (moves away from the body main body 11), the diaphragm retainer 17 is moved upward by each of a resilient force of the diaphragm 15 and the pressure of the fluid (gas), and the valve device 1 is brought into an open state.

As a result of the rising of the first piston 31, in the first seal member 33, the first inner peripheral portion 33A rises with the first piston 31, while the first outer peripheral portion 33B does not rise, and the first intermediate portion 33C is deformed with the rising of the first inner peripheral portion 33A. Likewise, as a result of the rising of the second piston 34, in the second seal member 36, the second inner peripheral portion 36A rises with the second piston 34, while the second outer peripheral portion 36B does not rise, and the second intermediate portion 36C is deformed with the rising of the second inner peripheral portion 36A.

To shift the valve device 1 from the opening state to the closed state, the three-way valve 4 is switched to the flow of the driving fluid discharged from the drive portion 30 (first and second pressure chambers S1 and S2) of the valve device 1 to the outside. This reduces the pressure in the inflow chamber R1, and as illustrated in FIG. 7D, brings the second poppet O-ring 44C of the poppet 44 away from the peripheral edge portion 241, and provides communication between the inflow chamber R1 and the decompression chamber R2. As a result, the driving fluid in the first and second pressure chambers S1 and S2 flows into each of the decompression chamber R2 and the inflow chamber R1 via the second driving fluid outlet port 26*c*, the third driving fluid outlet port 26*d*, the driving fluid inflow path 26*a*, and the first driving fluid outlet port 26*b* to be discharged to the outside via the driving fluid passage hole 24*g* and the driving fluid inlet port 25*d*.

As a result of lowering of the first piston 31 and the second piston 34, the first inner peripheral portion 33A of the first seal member 33 and the second inner peripheral portion 36A of the second seal member 36 also lower to bring each of the first seal member 33 and the second seal member 36 into an original state. The stem 26 is returned by the biasing forces of the compression coil springs 27 to the lower dead point, and the diaphragm 15 is pressed by the diaphragm retainer 17 to bring the valve device 1 into the closed state.

[Semiconductor Production Apparatus 100]

Next, a description will be given of a semiconductor production apparatus 100 in which the valve device 1 and the fluid supply system 2 each described above are used.

Figure 8:
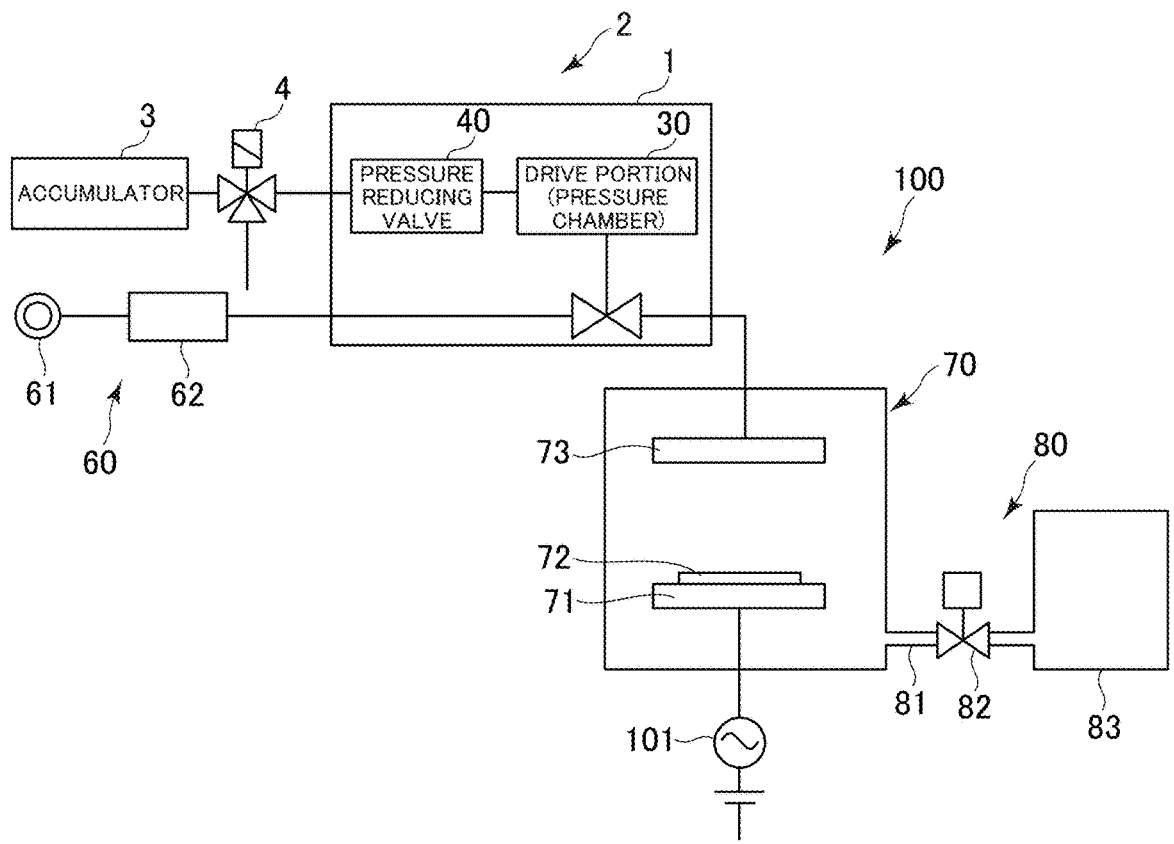
FIG. 8 illustrates a semiconductor production apparatus including the valve device and the fluid supply system each according to the present embodiment.

FIG. 8 illustrates the semiconductor production apparatus 100 including the valve device 1 and the fluid supply system 2 each according to the present embodiment.

As illustrated in FIG. 8, the semiconductor production apparatus 100 is, e.g., a CVD device which includes the fluid supply system 2, a gas supply portion 60, a vacuum chamber 70, and an exhaust portion 80 and forms a passivation film (oxide film) over a wafer.

The gas supply portion 60 includes a gas supply source 61 and a fluid control device 62. The vacuum chamber 70 includes a mounting table 71 for mounting thereon a wafer 72 and an electrode 73 for forming a thin film over the wafer 72. The vacuum chamber 70 is connected to a commercial power source 101. The exhaust portion 80 includes an exhaust pipe 81, an opening/closing valve 82, and a dust collector 83.

When a thin film is formed over the wafer 72, by the opening/closing of the valve device 1 in the fluid supply system 2, a supply of gas to the vacuum chamber 70 is controlled. When powder and granules generated as by-products when the thin film is formed over the wafer 72 are to be removed, the opening/closing valve 82 is brought into an open state, and the powder and granules are removed by the dust collector 83 via the exhaust pipe 81.

As described above, the actuator 20 of the present embodiment includes the pressure reducing valve 40 which reduces the pressure of the driving fluid supplied from the outside to the predetermined level and the first and second pistons 31 and 34 provided in the casing to form the first and second pressure chambers S1 and S2 together with the casing and driven by the driving fluid that has been pressure-reduced to the predetermined level resulting from the pressure reduction by the pressure reducing valve 40.

Even when the pressure of the driving fluid from the accumulator 3 varies, such a configuration allows the pressure reducing valve 40 to supply the driving fluid having the predetermined pressure into the first and second pressure chambers S1 and S2. Thus, it is possible to maintain an operating speed of the actuator 20 constant using a simple configuration and reduce fluctuations in respective operations of the first and second pistons 31 and 34.

By applying the actuator 20 to the valve device 1 and applying the valve device 1 to the fluid supply system 2 including the accumulator 3 which supplies the driving fluid and the three-way valve 4 which switches between the flows of the driving fluid, it is possible to maintain an opening/closing speed of the valve device 1 constant. Consequently, in the semiconductor production apparatus 100 including the valve device 1 or the fluid supply system 2, it is possible to supply a predetermined amount of the gas to the vacuum chamber 70 and thus form a film having an intended film thickness over the wafer.

The actuator 20 according to the present embodiment also includes the casing having the first and second outer peripheral portion containing grooves 22g and 23g formed in the inner peripheral portion thereof, the first and second pistons 31 and 34 having the first and second inner peripheral portion containing grooves 31c and 34c formed in the outer peripheral portion thereof, forming the first and second pressure chambers S1 and S2 together with the casing, and driven by the driving fluid from the outside, and the annular first and second seal members 33 and 36 having the first and second inner peripheral portions 33A and 36A to be fitted into the first and second outer peripheral portion containing grooves 22g and 23g, having the first and second outer peripheral portions 33B and 36B to be fitted into the first and second inner peripheral portion containing grooves 31c and 34c, and sealing the first and second pressure chambers S1 and S2.

In such a configuration, when the first and second pistons 31 and 34 move, only the first and second inner peripheral portions 33A and 36A of the first and second seal members 33 and 36 move together with the first and second pistons 31 and 34. This can inhibit the first and second seal members 33 and 36 from slidably moving along an inner peripheral surface of the casing and prevent abrasion of the first and second seal members 33 and 36. Consequently, even when the number of times the actuator 20 is used increases, the first and second pistons 31 and 34 are not abraded, and it is possible to reduce fluctuations in the operations of the first and second pistons 31 and 34.

By also applying the actuator 20 to the valve device 1, it is possible to maintain the opening/closing speed of the valve device 1 constant. As a result, in the semiconductor production apparatus 100 including the valve device 1, it is possible to supply a predetermined amount of gas to the vacuum chamber 70 and thereby form a film having an intended film thickness over the wafer.

The maximum distance along the axial direction of each of the first and second seal members 33 and 36 over which each of the first and second inner peripheral portions 33A and 36A can move relative to each of the first and second outer peripheral portions 33B and 36B is limited to a predetermined distance not more than half the thickness of each of the first and second seal members 33 and 36. This can inhibit the first and second seal members 33 and 36 from slidably moving along the inner peripheral surface of the casing and prevent abrasion of the first and second seal members 33 and 36.

The first and second seal members 33 and 36 also have the first and second intermediate portions 33C and 36C located between the first and second inner peripheral portions 33A and 36A and the first and second outer peripheral portions 33B and 36B and configured to have thicknesses smaller than those of the first and second inner peripheral portions 33A and 36A and the first and second outer peripheral portions 33B and 36B.

Such a configuration allows the first and second seal members 33 and 36 to follow the movement of the first and second pistons 31 and 34 only through deformation of the first and second intermediate portions 33C and 36C. Therefore, it is possible to prevent the first and second seal members 33 and 36 from slidably moving along the inner peripheral surface of the casing and prevent abrasion of the first and second seal members 33 and 36.

Note that the present disclosure is not limited to the embodiment described above. Those skilled in the art will appreciate that various additions, modifications, and the like are possible without departing from the scope of the present disclosure.

Figure 9:
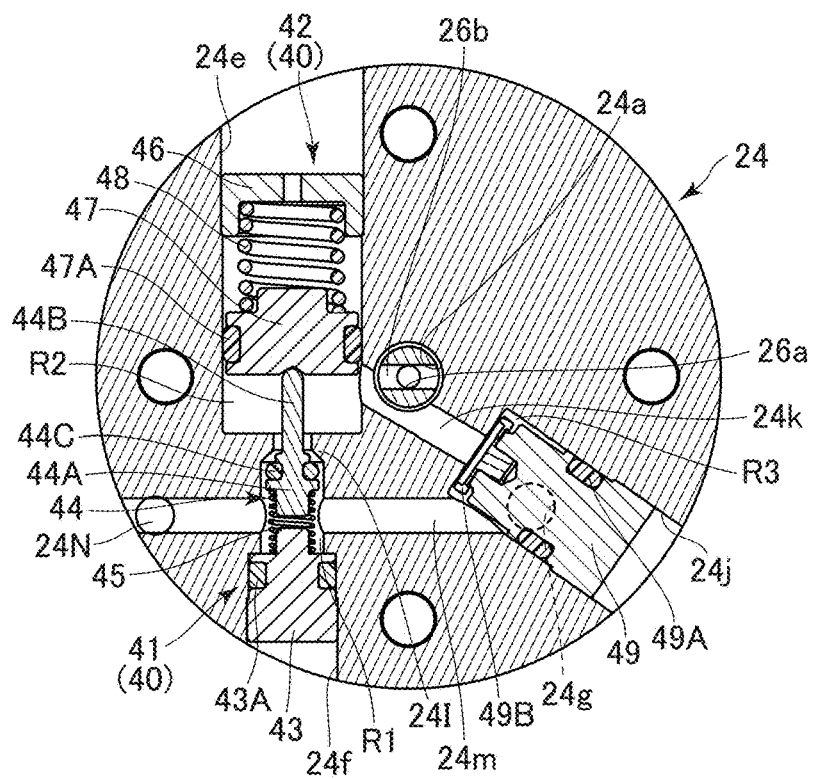
FIG. 9 is a view illustrating a mode in which a check valve is added to an intermediate casing.

For example, in the embodiment described above, as illustrated in FIG. 9, in addition to the pressure reducing valve 40, a check valve 49 may also be provided in the intermediate casing 24. In this case, in the intermediate casing 24, a third insertion hole 24j is formed, and a first communication hole 24k providing communication between the first insertion hole 24e and the third insertion hole 24j and a second communication hole 24m providing communication between the second insertion hole 24f and the third insertion hole 24j are formed. The second communication hole 24m has an end portion closed by a ball 24N. The driving fluid passage hole 24g of the intermediate casing 24 is formed to be located immediately above the check valve 49 and communicate with the third insertion hole 24j. The driving fluid inlet port 25d is formed at a position in the upper casing 25 located above the third insertion hole 24j of the intermediate casing 24 to have a lower end portion thereof communicating with the driving fluid passage hole 24g. Each of the driving fluid passage hole 24g and the driving fluid inlet port 25d corresponds to a driving fluid passage.

The check valve 49 is fitted in the third insertion hole 24j to be fixed to the intermediate casing 24, and has a check valve O-ring 49A and a valve body 49B made of a resin. A space in the third insertion hole 24j which is inner than the check valve 49 forms a check chamber R3. The check valve O-ring 49A prevents the driving fluid in the check chamber R3 from leaking to the outside thereof. The valve body 49B is displaceable depending on a pressure in the check chamber R3 and, by displacement of the valve body 49B, the check valve 49 is brought into a closed state or an open state. When the check valve 49 is in the closed state, communication between the check chamber R3 and the first communication hole 24k is cut off. When the check valve 49 is in the open state, communication is provided between the check chamber R3 and the first communication hole 24k.

When the driving fluid flows from the driving fluid passage hole 24g of the intermediate casing 24 into the check chamber R3, the check valve 49 is brought into the closed state, and the driving fluid flows into the inflow chamber R1 via the second communication hole 24m. Since the inflow chamber R1 and the decompression chamber R2 communicate with each other, the driving fluid that has flown into the inflow chamber R1 flows into the decompression chamber R2 to increase the pressure in the decompression chamber R2. When the pressure in the decompression chamber R2 increases, the pressure reducing piston 47 moves toward the spring retainer 46 against the biasing force of the pressure reducing spring 48. Then, when the pressure in the decompression chamber R2 reaches a predetermined level, the second poppet O-ring 44C of the poppet 44 comes into contact with the peripheral edge portion 241 to cut off the communication between the inflow chamber R1 and the decompression chamber R2.

As a result, the driving fluid having a predetermined pressure flows from the decompression chamber R2 into the first and second pressure chambers S1 and S2 via the first driving fluid outlet port 26b, the driving fluid inflow path 26a, the second driving fluid outlet port 26c, and the third driving fluid outlet port 26d. Consequently, the valve device 1 is brought into the open state.

Meanwhile, the three-way valve 4 is switched to the flow of the driving fluid discharged from the drive portion 30 (first and second pressure chambers S1 and S2) of the valve device 1 to the outside thereof to reduce the pressure in the check chamber R3 and bring the check valve 49 into the open state. This provides communication between the check chamber R3 and the first communication hole 24k to allow the driving fluid in the first and second pressure chambers S1 and S2 to be discharged from the first communication hole 24k and the check chamber R3 to the outside via the driving fluid inflow path 26a and the first driving fluid outlet port 26b. This also allows the driving fluid in the inflow chamber R1, the decompression chamber R2, and the second communication hole 24m to be discharged from the check chamber R3 to the outside thereof.

Thus, the actuator 20 includes the check valve 49 which is brought into the closed state when the driving fluid is introduced into the first and second pressure chambers S1 and S2 to allow the driving fluid to flow to the pressure reducing valve 40 and which is brought into the open state when the driving fluid is discharged from the first and second pressure chambers S1 and S2 to the outside thereof to allow the driving fluid to be discharged from the first and second pressure chambers S1 and S2 to the outside thereof.

In such a configuration, when the driving fluid is discharged from the first and second pressure chambers S1 and S2 to the outside thereof, the driving fluid is discharged to the outside without passing through the pressure reducing valve 40. This can enlarge a flow path from each of the first and second pressure chambers S1 and S2 to the check valve 49 to increase a discharged amount of the driving fluid, and thereby reduce the time required by the driving fluid to be discharged. As a result, it is also possible to reduce the time required by the valve device 1 to shift from the open state to the closed state. Note that, when only the pressure reducing valve 40 is provided, it is necessary to produce a pressure difference between spaces before and after the poppet main body 44A, and consequently an area of a gap (orifice portion) between the poppet main body 44A and the peripheral edge portion 241 cannot easily be increased. Accordingly, the discharged amount of the driving fluid cannot be increased.

In the embodiment described above, the actuator 20 is applied to the valve device 1, but may also be applied to another device. Also, in the embodiment described above, the switching member which switches between the flow of the driving fluid from the accumulator 3 to the valve device 1 and the flow of the driving fluid discharged from the drive portion 30 of the valve device 1 to the outside thereof is the three-way valve 4, but may also be another member.

The shape of each of the first and second seal members 33 and 36 is not limited to that shown in the embodiment described above. For example, each of the first and second seal members 33 and 36 may also have a circular, X-shaped, or U-shaped cross section. Each of the first and second pressure chambers S1 and S2 may also be configured to have a changeable internal volume.

In the embodiment described above, a case in which the semiconductor production apparatus 100 is a CVD device is described, but the semiconductor production apparatus 100 may also be a sputtering device or an etching device. Also in the embodiment described above, an embodiment in which the valve device 1 is disposed with the actuator 20 facing upward and the body 10 facing downward is described, but the direction in which the valve device 1 is disposed is not limited thereto. The valve device 1 may also be disposed in a horizontal direction or in an upside down direction.

Figure 10:
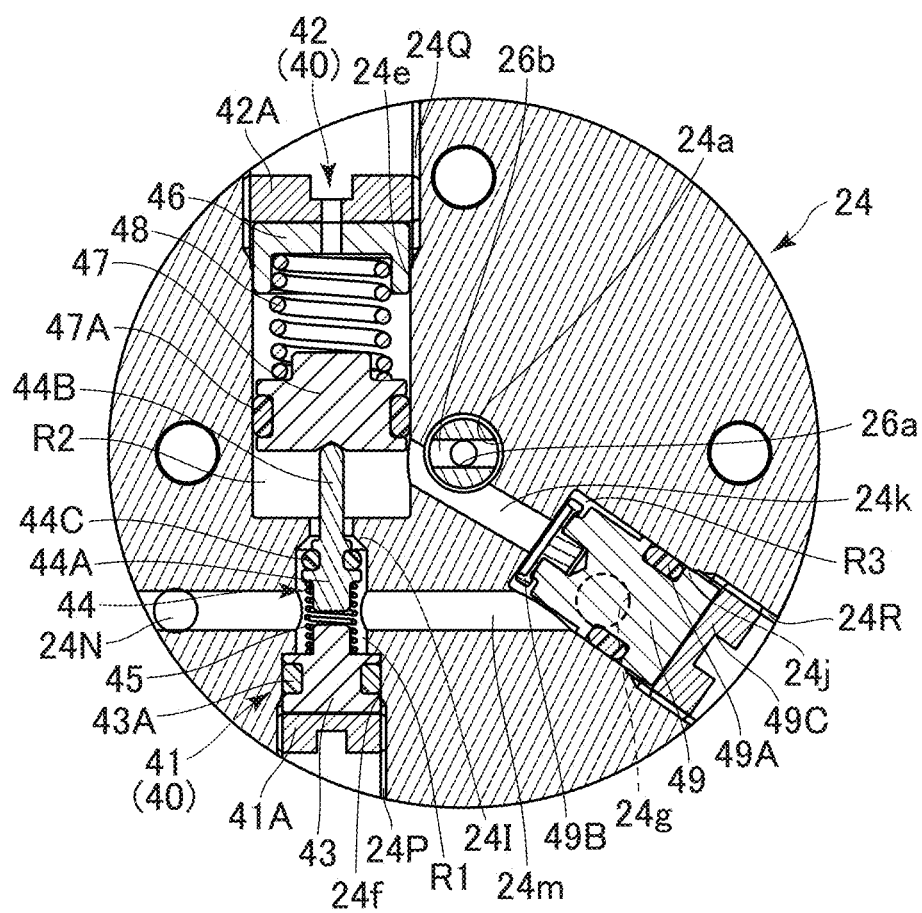
FIG. 10 is a view illustrating a state where a poppet plug, a spring retainer, and a check valve are fixed to the intermediate casing using setscrews.

FIG. 10 illustrates a state where the poppet plug 43, the spring retainer 46, and the check valve 49 are fixed to the intermediate casing 24 using the setscrews 41A, 42A and 49C.

In the embodiment described above, the poppet plug 43, the spring retainer 46, and the check valve 49 are respectively fitted in the second insertion hole 24f, the first insertion hole 24e, and the third insertion hole 24j and fixed to the intermediate casing 24. However, as illustrated in FIG. 10, it may also be possible to respectively form internal thread portions 24P, 24Q, and 24R on sides of respective openings of the second insertion hole 24f, the first insertion hole 24e, and the third insertion hole 24j and respectively insert the poppet plug 43, the spring retainer 46, and the check valve 49 into the second insertion hole 24f, the first insertion hole 24e, and the third insertion hole 24j such that the poppet plug 43, the spring retainer 46, and the check valve 49 are slidably movable therein. Then, the setscrews 41A, 42A, and 49C having the respective external threshold portions are screwed into the respective internal thread portions 24P, 24Q, and 24R. As a result, the poppet plug 43 is supported with respect to the intermediate casing 24, while being interposed between the poppet spring 45 and the setscrew 41A. The spring retainer 46 is supported with respect to the intermediate casing 24, while being interposed between the pressure reducing spring 48 and the setscrew 42A.

The setscrews 41A, 42A, and 49C are setscrews with negative grooves. The poppet plug 43, the spring retainer 46, the poppet spring 45, the pressure reducing spring 48, the setscrew 41A, and the setscrew 42A respectively correspond to a first spring retainer, a second spring retainer, a first spring, a second spring, a first setscrew, and a second setscrew. The setscrew 41A forms a portion of the poppet portion 41. The setscrew 42A forms a portion of the pressure reducing portion 42.

In such a configuration, an amount of screwing in of each of the setscrews 41A and 42A is adjusted to move the poppet plug 43 and the spring retainer 46 and thus allow the respective biasing forces of the poppet spring 45 and the pressure reducing spring 48 to be adjusted. Thus, it is possible to adjust a drive pressure (predetermined pressure) for the pressure reducing valve 40 and adjust the opening/closing speed of the valve device 1. As a result, it is possible to uniformize the opening/closing speed of each of the valves 1 and uniformize respective speeds of the opening operation and the closing operation of the valve device 1.

What is claimed is:

1. An actuator comprising:
a casing;
a pressure reducing valve provided in the casing to reduce a pressure of a driving fluid supplied from an outside of the casing to a predetermined level; and
a piston provided in the casing to form a pressure chamber together with the casing and driven by the driving fluid that has been pressure-reduced to the predetermined level,
wherein
the casing has a first insertion hole and a second insertion hole coaxial with the first insertion hole each formed therein, the first insertion hole and the second insertion hole communicate with each other, and each of the first insertion hole and the second insertion hole has an internal thread portion formed on a side of an opening thereof,
the pressure reducing valve includes a poppet portion provided in the second insertion hole and a pressure reducing portion provided in the first insertion hole,
the poppet portion has a first spring retainer, a poppet, a first spring, and a first setscrew,
the pressure reducing portion has a second spring retainer, a pressure reducing piston, a second spring, and a second setscrew,
the first spring retainer is inserted into the second insertion hole to be slidably moveable therein, and a space in the second insertion hole which is inner than the first spring retainer forms an inflow chamber into which the driving fluid flows,
the poppet has a poppet main body located in the inflow chamber to move into contact with an away from a peripheral edge portion of a portion of the casing in which the first insertion hole and the second insertion hole communicate with each other, and a rod expending from a leading end of the poppet main body into the first insertion hole,
the first spring is provided between the first spring retainer and the poppet to bias the poppet toward the pressure reducing portion,
the first setscrew is screwed into the internal thread portion of the first insertion hole to support the first spring retained with respect to the casing,
the second spring retainer is inserted into the second insertion hole to be slideably moveable therein;
the pressure reducing piston is provided to be moveable in a space in the first insertion hole which is inner than the second spring retainer, a space in the first insertion hole which is inner than the pressure reducing piston forms a decompression chamber into which the driving fluid flows, and a leading end of the rod comes into contact with the pressure reducing piston,
the second spring is provided between the second spring retainer and the pressure reducing piston to bias the pressure reducing piston toward the poppet portion,
the second setscrew is screwed into the internal thread portion of the second insertion hole to support the second spring retainer with respect to casing,
respective biasing forces of the first spring and the second spring are set such that, in a state where the driving fluid has not flown into either of the inflow chamber and the decompression chamber or where a pressure increase in the decompression chamber resulting from inflow of the driving fluid is not sufficient, the poppet main body moves away from the peripheral edge portion to provide communication between the inflow chamber and the decompression chamber, and,
when the pressure in the decompression chamber is increased by the inflow of the driving fluid from the inflow chamber, the pressure reducing piston moves toward the second spring retainer against the biasing force of the second spring and, when the pressure in the decompression chamber reaches the predetermined level, the poppet main body comes into contact with the peripheral edge portion to cut off the communication between the inflow chamber and the decompression chamber.

2. The actuator according to claim 1, further comprising:
a check valve provided in the casing, the check valve being brought into a closed state when the driving fluid is introduced into the pressure chamber, while being brought into an open state when the driving fluid is discharged from the pressure chamber to the outside to allow the driving fluid to be discharged from the pressure chamber to the outside.

3. The actuator according to claim 2, wherein the casing is formed with a driving fluid passage immediately above the check value to allow the driving fluid to flow into or from the check value.

4. A valve device comprising:
a body in which a fluid passage is formed;
a valve body which opens and closes the fluid passage;
a stem which moves closer to and away from the body to cause the valve body to open and close the fluid passage;
a casing;
a pressure reducing valve provided in the casing to reduce a pressure of a driving fluid supplied from an outside of the casing to a predetermined level; and
a drive portion provided in the casing to drive the stem using the driving fluid that has been pressure-reduced to the predetermined level resulting from the pressure reduction by the pressure reducing valve,
wherein
the casing has a first insertion hole and a second insertion hole coaxial with the first insertion hole each formed therein, the first insertion hole and the second insertion hole communicate with each other, and each of the first insertion hole and the second insertion hole has an internal thread portion formed on a side of an opening thereof,
the pressure reducing valve includes a poppet portion provided in the second insertion hole and a pressure reducing portion provided in the first insertion hole,
the poppet portion has a first spring retainer, a poppet, a first spring, and a first setscrew,
the pressure reducing portion has a second spring retainer, a pressure reducing piston, a second spring, and a second setscrew,
the first spring retainer is inserted into the second insertion hole to be slidably moveable therein, and a space in the second insertion hole which is inner than the first spring retainer forms an inflow chamber into which the driving fluid flows, the poppet has a poppet main body located in the inflow chamber to move into contact with an away from a peripheral edge portion of a portion of the casing in which the first insertion hole and the second insertion hole communicate with each other, and a rod expending from a leading end of the poppet main body into the first insertion hole, the first spring is provided between the first spring retainer and the poppet to bias the poppet toward the pressure reducing portion, the first setscrew is screwed into the internal thread portion of the first insertion hole to support the first spring retained with respect to the casing, the second spring retainer is inserted into the second insertion hole to be slideably moveable therein;

the pressure reducing piston is provided to be moveable in a space in the first insertion hole which is inner than the second spring retainer, a space in the first insertion hole which is inner than the pressure reducing piston forms a decompression chamber into which the driving fluid flows, and a leading end of the rod comes into contact with the pressure reducing piston, the second spring is provided between the second spring retainer and the pressure reducing piston to bias the pressure reducing piston toward the poppet portion, the second setscrew is screwed into the internal thread portion of the second insertion hole to support the second spring retainer with respect to casing, respective biasing forces of the first spring and the second spring are set such that, in a state where the driving fluid has not flown into either of the inflow chamber and the decompression chamber or where a pressure increase in the decompression chamber resulting from inflow of the driving fluid is not sufficient, the poppet main body moves away from the peripheral edge portion to provide communication between the inflow chamber and the decompression chamber, and, when the pressure in the decompression chamber is increased by the inflow of the driving fluid from the inflow chamber, the pressure reducing piston moves toward the second spring retainer against the biasing force of the second spring and, when the pressure in the decompression chamber reaches the predetermined level, the poppet main body comes into contact with the peripheral edge portion to cut off the communication between the inflow chamber and the decompression chamber.

5. The valve device according to claim 4, further comprising:

a check valve provided in the casing, the check valve being brought into a closed state when the driving fluid is introduced into the drive portion, while being brought into an open state when the driving fluid is discharged from the drive portion to the outside to discharge the driving fluid from the drive portion to the outside.

6. The valve device according to claim 5, wherein the casing is formed with a driving fluid passage immediately above the check value to allow the driving fluid to flow into or from the check value.

7. A fluid supply system comprising:

a supply source which supplies a driving fluid;

a valve device to be driven using the driving fluid supplied from the supply source, the valve device including a body in which a fluid passage is formed, a valve body which opens and closes the fluid passage, a stem which moves closer to and away from the body to cause the valve body to open and close the fluid passage, a casing, and an actuator having therein a pressure reducing valve which reduces a pressure of the driving fluid to a predetermined level and a drive portion which drives the stem using the driving fluid that has been pressure-reduced to the predetermined level; and a switching member which switches between a flow of the driving fluid supplied from the supply source to the valve device and a flow of the driving fluid discharged from the drive portion of the valve device to an outside thereof, wherein the casing has a first insertion hole and a second insertion hole coaxial with the first insertion hole each formed therein, the first insertion hole and the second insertion hole communicate with each other, and each of the first insertion hole and the second insertion hole has an internal thread portion formed on a side of an opening thereof, the pressure reducing valve includes a poppet portion provided in the second insertion hole and a pressure reducing portion provided in the first insertion hole, the poppet portion has a first spring retainer, a poppet, a first spring, and a first setscrew, the pressure reducing portion has a second spring retainer, a pressure reducing piston, a second spring, and a second setscrew, the first spring retainer is inserted into the second insertion hole to be slidably moveable therein, and a space in the second insertion hole which is inner than the first spring retainer forms an inflow chamber into which the driving fluid flows, the poppet has a poppet main body located in the inflow chamber to move into contact with an away from a peripheral edge portion of a portion of the casing in which the first insertion hole and the second insertion hole communicate with each other, and a rod expending from a leading end of the poppet main body into the first insertion hole, the first spring is provided between the first spring retainer and the poppet to bias the poppet toward the pressure reducing portion, the first setscrew is screwed into the internal thread portion of the first insertion hole to support the first spring retained with respect to the casing, the second spring retainer is inserted into the second insertion hole to be slideably moveable therein;

the pressure reducing piston is provided to be moveable in a space in the first insertion hole which is inner than the second spring retainer, a space in the first insertion hole which is inner than the pressure reducing piston forms a decompression chamber into which the driving fluid flows, and a leading end of the rod comes into contact with the pressure reducing piston, the second spring is provided between the second spring retainer and the pressure reducing piston to bias the pressure reducing piston toward the poppet portion, the second setscrew is screwed into the internal thread portion of the second insertion hole to support the second spring retainer with respect to casing, respective biasing forces of the first spring and the second spring are set such that, in a state where the driving fluid has not flown into either of the inflow chamber and the decompression chamber or where a pressure increase in the decompression chamber resulting from inflow of the driving fluid is not sufficient, the poppet main body moves away from the peripheral edge portion to provide communication between the inflow chamber and the decompression chamber, and, when the pressure in the decompression chamber is increased by the inflow of the driving fluid from the inflow chamber, the pressure reducing piston moves toward the second spring retainer against the biasing force of the second spring and, when the pressure in the decompression chamber reaches the predetermined level, the poppet main body comes into contact with the peripheral edge portion to cut off the communication between the inflow chamber and the decompression chamber.

\* \* \* \* \*